(12) United States Patent
Zhou

(10) Patent No.: US 11,374,196 B2
(45) Date of Patent: Jun. 28, 2022

(54) ORGANIC LIGHT EMITTING DIODE DISPLAY PANEL WITH ORGANIC MATERIAL STRUCTURE ON UPPER AND LOWER PORTIONS OF AN INORGANIC LAYER AND LOWER PORTION OF SECOND SUBSTRATE

(71) Applicant: Wuhan China Star Optoelectronics Semiconductor Display Technology Co., Ltd., Wuhan (CN)

(72) Inventor: Zhiwei Zhou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 235 days.

(21) Appl. No.: 16/612,381

(22) PCT Filed: Aug. 6, 2019

(86) PCT No.: PCT/CN2019/099375
§ 371 (c)(1),
(2) Date: Nov. 10, 2019

(87) PCT Pub. No.: WO2020/237827
PCT Pub. Date: Dec. 3, 2020

(65) Prior Publication Data
US 2021/0336210 A1    Oct. 28, 2021

(30) Foreign Application Priority Data
May 27, 2019   (CN) .......................... 201910447320.4

(51) Int. Cl.
*H01L 51/52*      (2006.01)
*H01L 27/15*      (2006.01)
(Continued)

(52) U.S. Cl.
CPC .......... *H01L 51/5253* (2013.01); *H01L 27/15* (2013.01); *H01L 27/3262* (2013.01); *H01L 51/0097* (2013.01)

(58) Field of Classification Search
CPC . H01L 51/5253; H01L 27/3262; H01L 27/15; H01L 51/0097
(Continued)

(56) References Cited

U.S. PATENT DOCUMENTS

2003/0117066 A1\* 6/2003 Silvernail ........... H01L 51/5237
313/504
2005/0051763 A1  3/2005 Affinito et al.
(Continued)

FOREIGN PATENT DOCUMENTS

CN    103137654     6/2013
CN    105206763    12/2015
(Continued)

*Primary Examiner* — Xia L Cross

(57) ABSTRACT

An organic light-emitting diode (OLED) display panel including a composite substrate including a first substrate, a barrier layer, a plurality of inorganic layers each interlaced therein with an organic material structure, and a second substrate interlaced therein with an organic material structure; a buffer layer disposed on the composite substrate; a thin film transistor layer disposed on the buffer layer; an OLED device layer disposed on the thin film transistor layer; and an encapsulation layer disposed on the OLED device layer.

12 Claims, 3 Drawing Sheets

(51) Int. Cl.
*H01L 27/32* (2006.01)
*H01L 51/00* (2006.01)

(58) Field of Classification Search
USPC .......................................................... 257/40
See application file for complete search history.

(56) References Cited

U.S. PATENT DOCUMENTS

| | | |
|---|---|---|
| 2014/0152174 A1 | 6/2014 | Wang et al. |
| 2017/0117504 A1 | 4/2017 | Kim et al. |
| 2017/0196101 A1* | 7/2017 | Ki .................. H05K 5/0017 |
| 2017/0229665 A1 | 8/2017 | Park et al. |
| 2018/0309088 A1* | 10/2018 | Gong ................ H01L 51/5253 |
| 2019/0115407 A1* | 4/2019 | Cho .................. H01L 27/3262 |
| 2019/0273221 A1 | 9/2019 | Liu et al. |
| 2020/0035768 A1* | 1/2020 | Okabe ............... H01L 51/5012 |

FOREIGN PATENT DOCUMENTS

| | | |
|---|---|---|
| CN | 108281388 | 7/2018 |
| CN | 108638621 | 10/2018 |
| CN | 108878680 | 11/2018 |

* cited by examiner

ORGANIC LIGHT EMITTING DIODE DISPLAY PANEL WITH ORGANIC MATERIAL STRUCTURE ON UPPER AND LOWER PORTIONS OF AN INORGANIC LAYER AND LOWER PORTION OF SECOND SUBSTRATE

RELATED APPLICATIONS

This application is a National Phase of PCT Patent Application No. PCT/CN2019/099375 having International filing date of Aug. 6, 2019, which claims the benefit of priority of Chinese Patent Application No. 201910447320.4 filed on May 27, 2019. The contents of the above applications are all incorporated by reference as if fully set forth herein in their entirety.

FIELD AND BACKGROUND OF THE INVENTION

The present invention relates to the field of display technology, and in particular, to an organic light emitting diode display panel.

Effectively blocking moisture ($H_2O$) and oxygen ($O_2$) is very important for organic light-emitting diode (OLED) display panels. Water and oxygen can react with organic compounds of the luminescent layer in the display panel and corrode metals in the cathode material. They not only reduce luminous efficiency but also form a large number of black spots due to the deterioration of the luminescent material, which greatly affects the lifetime of the OLED device. Therefore, in order to prevent moisture and oxygen from penetrating into the OLED device, thin-film encapsulation (TFE) is implemented to protect the OLED device.

Technical Problem

As shown in FIG. 1, a back side of current OLED device, except for polyimide film layers 10 and 30, only includes film layers such as barrier layer 20 and buffer layer 40 having a thickness of several hundred nanometers. There are a certain number of pinholes in the nitrogen oxides and silicon oxides in these layers. Therefore, moisture or oxygen easily passes through the pinholes or other microstructures of the nanometer-thick inorganic film layer to the thin film transistor layer 50 and the OLED device layer 60, thereby destroying the light-emitting layer material.

As shown in FIG. 2, a water vapor transmission rate (WVTR) experiment further proves that the water vapor transmission rate of a conventional OLED device is $10^{-3}$ number magnitude, which is much higher than $10^{-6}$ number magnitude required for water and vapor blocking of the OLED device.

Further, considering bendability of a display panel, and its fragile inorganic film layers such as a barrier layer or a buffer layer in the vicinity of its substrate layer, which is subjected to large stress when the display panel is bending, thereby, it should not be designed too thick. Consequently, the ability of these inorganic film layers of only a few hundred nanometers thick to prevent water and oxygen intrusion is difficult to improve simply by increasing the thickness of the film layer.

In addition, in the conventional OLED display panel, since the properties of its inorganic film layer and organic film layer are too different, an interface bonding between the inorganic film layer and the organic film layer is poor, consequently, a peeling of its film layers often occurs.

SUMMARY OF THE INVENTION

An object of the present invention to provide an organic light-emitting diode (OLED) display panel which can improve blocking of moisture and oxygen of an OLED display panel and can improve a problem of peeling between its layers. In addition, it also can prevent the OLED display panel from being cracked due to excessive stress when bent.

To achieve the above objective, the present invention provides an organic light-emitting diode display panel, including: a composite substrate having a first substrate, a barrier layer, a plurality of inorganic layers each interlaced therein with an organic material structure, and a second substrate interlaced therein with an organic material structure; a buffer layer disposed on the composite substrate; a thin film transistor layer disposed on the buffer layer; an OLED device layer disposed on the thin film transistor layer; and an encapsulation layer disposed on the OLED device layer.

Preferably, the composite substrate includes, from bottom to top, a first substrate, a barrier layer, a first inorganic layer interlaced therein with a first organic material structure, a second inorganic layer interlaced therein with a second organic material structure and a third organic material structure, and a second substrate interlaced therein with a third organic material structure, wherein an upper half and lower half of the third organic material structure each are interlaced in the second substrate and the second inorganic layer, respectively.

Preferably, the first substrate and the second substrate are composed of polyimide.

Preferably, the barrier layer is composed of silicon dioxide.

Preferably, the barrier layer has a thickness of 0.2-1 μm.

Preferably, the inorganic layer is composed of silicon nitride.

Preferably, the inorganic layer is formed by chemical vapor deposition.

Preferably, the organic material structure has a grid-like structure.

Preferably, the grid-like structure is formed by photolithography.

Preferably, the thin film transistor layer is composed of indium tin oxide.

The invention provides another organic light emitting diode display panel, including: a composite substrate having a first substrate, a barrier layer, a plurality of inorganic layers each interlaced therein with an organic material structure, and a second substrate interlaced therein with an organic material structure, the first substrate and the second substrate are composed of polyimide, and the barrier layer is composed of silicon dioxide; a buffer layer disposed on the composite substrate; a thin film transistor layer disposed on the buffer layer; an OLED device layer disposed on the thin film transistor layer; and an encapsulation layer disposed on the OLED device layer.

Preferably, the composite substrate includes, from bottom to top, a first substrate, a barrier layer, a first inorganic layer interlaced therein with a first organic material structure, a second inorganic layer interlaced therein with a second organic material structure and a third organic material structure, and a second substrate interlaced therein with a third organic material structure, wherein an upper half and lower half of the third organic material structure each are interlaced in the second substrate and the second inorganic layer, respectively.

Preferably, the barrier layer has a thickness of 0.2-1 μm.

Preferably, the inorganic layer is composed of silicon nitride.

Preferably, the inorganic layer is formed by chemical vapor deposition.

Preferably, the organic material structure has a grid-like structure.

Preferably, the grid-like structure is formed by photolithography.

Preferably, the thin film transistor layer is composed of indium tin oxide.

The invention further provides another organic light-emitting diode display panel, including: a composite substrate having a first substrate, a barrier layer, a plurality of inorganic layers each interlaced therein with an organic material structure, and a second substrate interlaced therein with an organic material structure, the barrier layer has a thickness of 0.2-1 μm; a buffer layer disposed on the composite substrate; a thin film transistor layer disposed on the buffer layer; an OLED device layer disposed on the thin film transistor layer; and an encapsulation layer disposed on the OLED device layer; wherein the composite substrate includes, from bottom to top, a first substrate, a barrier layer, a first inorganic layer interlaced therein with a first organic material structure, a second inorganic layer interlaced therein with a second organic material structure and a third organic material structure, and a second substrate interlaced therein with a third organic material structure, wherein an upper half and lower half of the third organic material structure each are interlaced in the second substrate and the second inorganic layer, respectively.

Preferably, the first organic material structure, the second organic material structure, and the third organic material structure each have grid-like structures.

Beneficial Effect

The inorganic silicon nitride disclosed in the present invention has a hollow grid-like structure directly bonded to the barrier layer 200 which is also composed of inorganic substances, thereby improving the peeling problem between layers. Further, the lower half of the second substrate 500 is simultaneously bonded to the grid-like third organic material structure 501 and the thickened second inorganic layer 400 to increase the bonding strength, thereby effectively reducing a risk of peeling between the layers. Moreover, the film structure deposited by silicon nitride has high compactness, low pinhole incidence and very good water and oxygen blocking properties. Therefore, a composite film layer formed of silicon nitride and organic material can effectively improve the problem of moisture and oxygen invading the OLED device. In addition, the film layer having the grid-like organic structure can transfer stress of a bending zone to a non-bending zone to reduce the risk of cracking.

BRIEF DESCRIPTION OF THE SEVERAL VIEWS OF THE DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DESCRIPTION OF SPECIFIC EMBODIMENTS OF THE INVENTION

The technical solutions in the embodiments of the present invention will be clearly and completely described in the following with reference to the accompanying drawings. It is obvious that the described embodiments are only a part of the embodiments of the invention, and not all of the embodiments. All other embodiments obtained by a person skilled in the art based on the embodiments of the present invention without creative efforts are within the scope of the present application.

The following description of the embodiments is provided to illustrate the specific embodiments of the invention. Directional terminology mentioned in the application, such as "above", "under", "front", "back", "left", "right", "inside", "outside", "side", etc., are only refer to the directions of the accompanying drawings. Therefore, the directional terms are used to illustrate and understand the present invention rather than limiting the invention.

Figure 1:
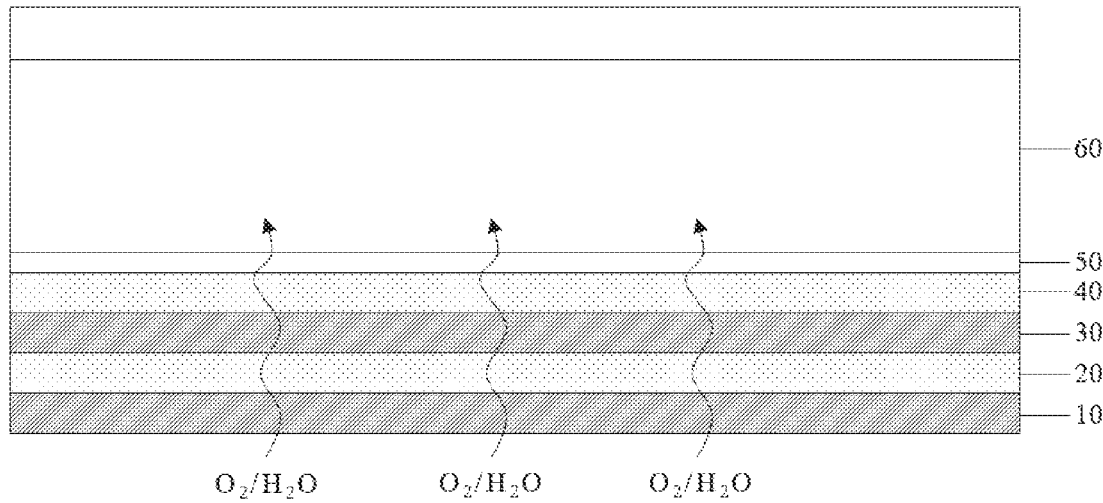
FIG. 1 is a schematic cross-sectional view of a conventional organic light-emitting diode display panel.
Figure 2:
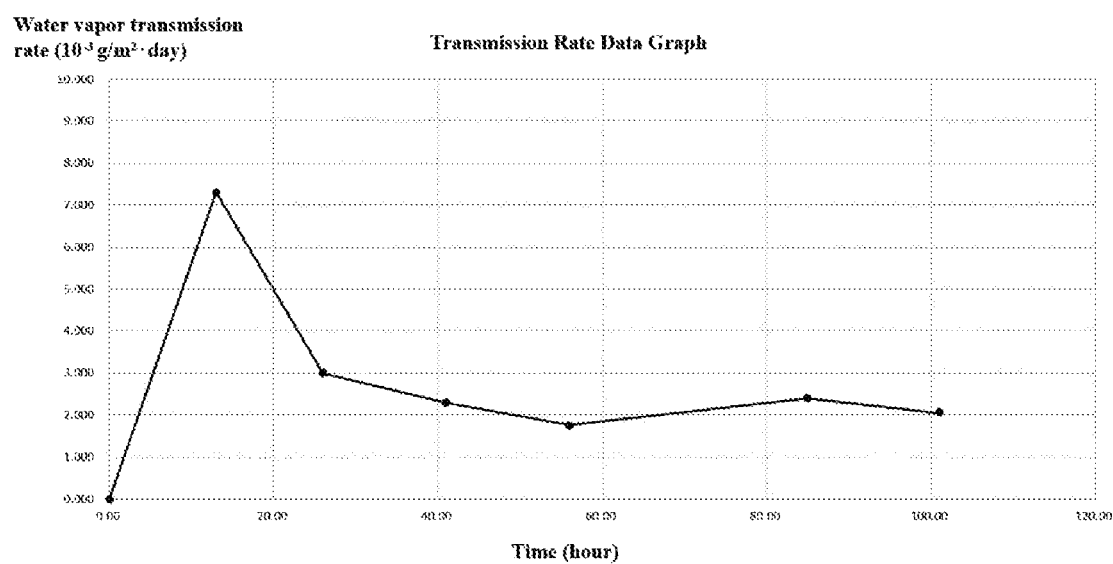
FIG. 2 is a result of an experimental analysis of water vapor transmission rate of a conventional organic light-emitting diode display panel.
Figure 3:
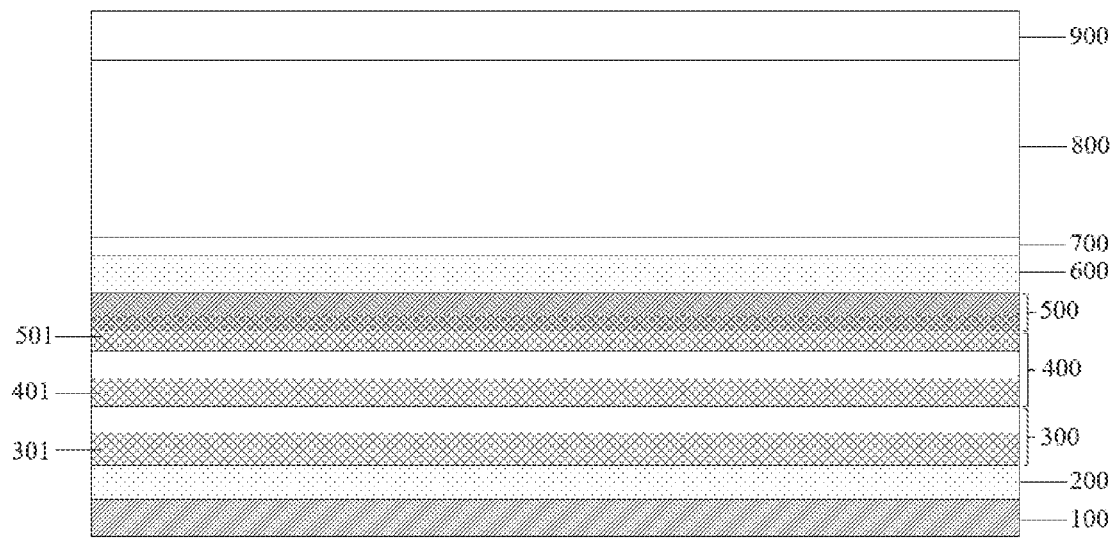
FIG. 3 is a schematic cross-sectional view showing an organic light-emitting diode display panel according to an embodiment of the present invention.

As shown in FIG. 3, an OLED display panel of an embodiment of the present invention includes: a composite substrate; the composite substrate includes, from bottom to top: a first substrate 100, a barrier layer 200, a first inorganic layer 300 interlaced therein with a first organic material structure 301, a second inorganic layer 400 interlaced therein with a second organic material structure 401 and a third organic material structure 501, a second substrate 500 interlaced therein with a third organic material structure 501, wherein an upper half and lower half of the third organic material structure 501 each are interlaced in the second substrate 500 and the second inorganic layer 400, respectively, the first organic material structure 301, the second organic material structure 401, and the third organic material structure 501 all have grid-like structures; a buffer layer 600 disposed on the composite substrate; a thin film transistor layer 700 disposed on the buffer layer 600; an organic light-emitting diode device layer 800 disposed on the thin film transistor layer 700; and an encapsulation layer 900 disposed on the organic light-emitting diode device layer 800.

Figure 4:
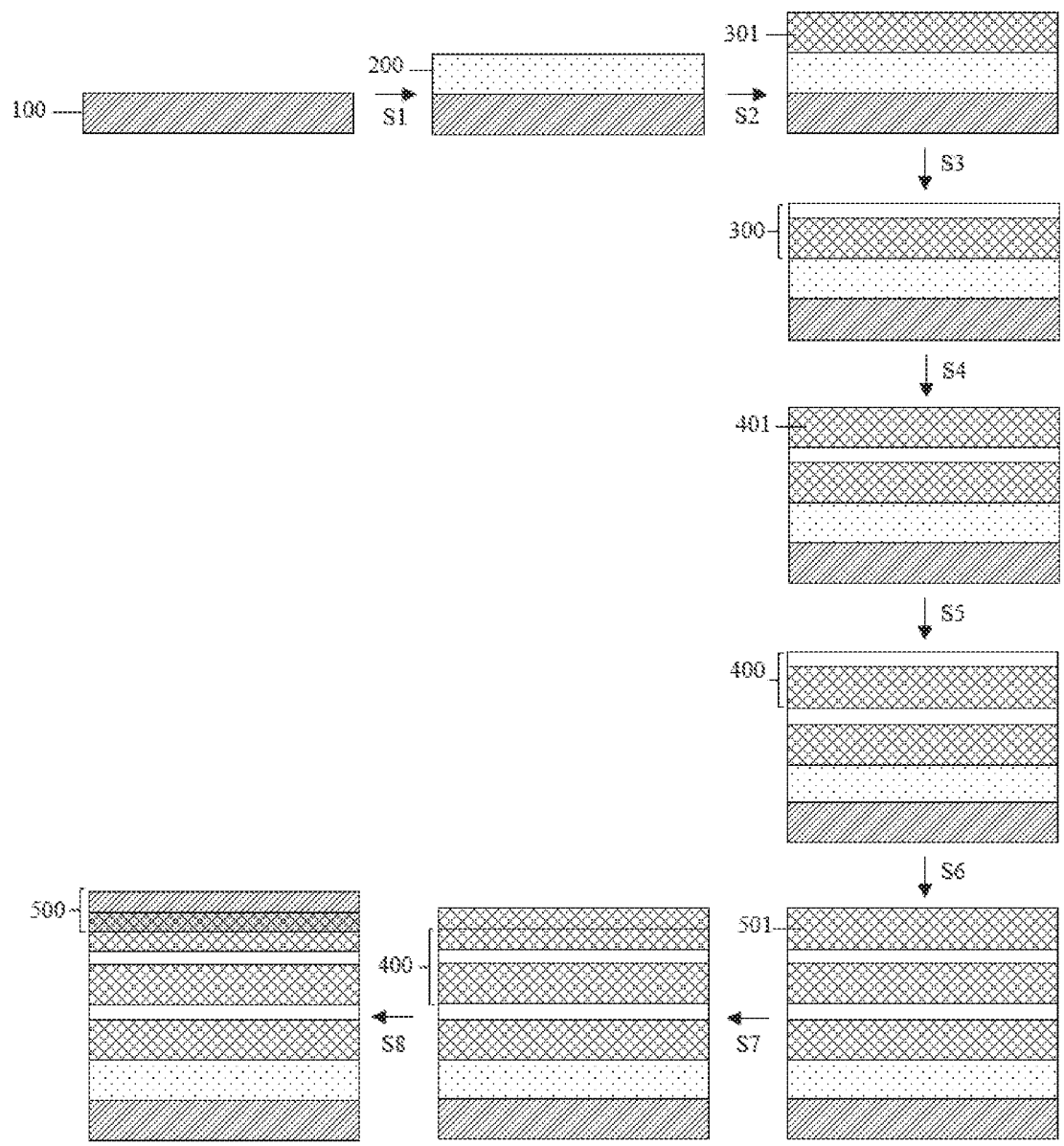
FIG. 4 is a schematic diagram showing a manufacturing process of a composite substrate of an organic light-emitting diode display panel according to an embodiment of the invention.

As shown in FIG. 4, a manufacturing process of the composite substrate of the OLED display panel of the embodiment of the present invention is as follows: S1, firstly depositing silicon dioxide ($SiO_2$) on the first substrate 100 composed of polyimide to form a barrier layer 200 having a thickness of about 0.3-0.5 μm; S2, then coating an organic material on the barrier layer 200, and exposing with a photomask to form a first organic material structure 301 having a grid-like structure by steps of subsequent development and the like; S3, then depositing silicon nitride on the barrier layer 200 and the first organic material structure 301 having a grid-like structure by a low-temperature chemical vapor deposition process until its thickness exceeds a height of the first organic material structure 301, forming a first Inorganic layer 300; S4, then coating an organic material on the first inorganic layer 300, and exposing with a photomask to form a second organic material structure 401 having a grid-like structure by steps of subsequent development and the like; S5, then depositing silicon nitride on the first inorganic layer 300 and the second organic material structure 401 having a grid-like structure by a low-temperature chemical vapor deposition process until its thickness exceeds a height of the second organic material structure 401, forming a second inorganic layer 400; S6, then coating the organic material on the second inorganic layer 400, and exposing with a photomask and by subsequent development and the like to form a third organic material structure 501 having a grid-like structure; S7, and then depositing silicon nitride on the second inorganic layer 400 and the lower half of the third organic material structure 501 having a grid-like structure by a low-temperature chemical vapor deposition process to form a thickened second inorganic layer 400; S8, finally, coating polyimide on the thickened second inorganic layer 400 and the upper half of the third organic material structure 501, and forming the second substrate 500 by baking process or the like.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. An organic light-emitting diode (OLED) display panel, comprising:
    a composite substrate comprising a first substrate, a barrier layer, a first inorganic layer, a second inorganic layer, a first organic material structure, a second organic material structure, a third organic material structure, and a second substrate, wherein the first organic material structure is inside the first inorganic layer, the second organic material structure is inside a lower portion of the second inorganic layer, a lower portion of the third organic material structure is inside an upper portion of the second inorganic layer, and an upper portion of the third organic material structure is inside the second substrate, wherein the first substrate and the second substrate are composed of polyimide, and wherein the first organic material structure, the second organic material structure, and the third organic material structure space apart from each other and each are grid-like structures;
    a buffer layer disposed on the composite substrate;
    a thin film transistor layer disposed on the buffer layer;
    an OLED device layer disposed on the thin film transistor layer; and
    an encapsulation layer disposed on the OLED device layer.

2. The OLED display panel according to claim 1, wherein the first inorganic layer and the second inorganic layer are composed of silicon nitride.

3. The organic light-emitting diode display panel according to claim 1, wherein the first inorganic layer and the second inorganic layer are formed by chemical vapor deposition.

4. The OLED display panel according to claim 1, wherein the grid-like structures are formed by photolithography.

5. The OLED display panel according to claim 1, wherein the thin film transistor layer is composed of indium tin oxide.

6. An organic light-emitting diode (OLED) display panel comprising:
    a composite substrate comprising a first substrate, a barrier layer, a first inorganic layer, a second inorganic layer, a first organic material structure, a second organic material structure, a third organic material structure, and a second substrate, wherein the first organic material structure is inside the first inorganic layer, the second organic material structure is inside a lower portion of the second inorganic layer, a lower portion of the third organic material structure is inside an upper portion of the second inorganic layer, and an upper portion of the third organic material structure is inside the second substrate, wherein the first substrate and the second substrate are composed of polyimide, and the barrier layer is composed of silicon dioxide, and wherein the first organic material structure, the second organic material structure, and the third organic material structure space apart from each other and each are grid-like structures;
    a buffer layer disposed on the composite substrate;
    a thin film transistor layer disposed on the buffer layer;
    an OLED layer disposed on the thin film transistor layer; and
    an encapsulation layer disposed on the organic light-emitting diode device layer.

7. The OLED display panel according to claim 6, wherein the barrier layer has a thickness of 0.2-1 µm.

8. The OLED panel according to claim 6, wherein the first inorganic layer and the second inorganic layer are composed of silicon nitride.

9. The OLED display panel according to claim 6, wherein the first inorganic layer and the second inorganic layer are formed by chemical vapor deposition.

10. The OLED display panel according to claim 6, wherein the grid-like structures are formed by photolithography.

11. The OLED display panel according to claim 6, wherein the thin film transistor layer is composed of indium tin oxide.

12. An organic light-emitting diode (OLED) display panel, comprising:
    a composite substrate comprising a first substrate, a barrier layer, a first inorganic layer, a second inorganic layer, a first organic material structure, a second organic material structure, a third organic material structure, and a second substrate, wherein the first organic material structure is inside the first inorganic layer, the second organic material structure is inside a lower portion of the second inorganic layer, a lower portion of the third organic material structure is inside an upper portion of the second inorganic layer, and an upper portion of the third organic material structure is inside the second substrate, wherein the barrier layer has a thickness of 0.2-1 µm, and wherein the first organic material structure, the second organic material structure, and the third organic material structure space apart from each other and each are grid-like structures;
    a buffer layer disposed on the composite substrate;
    a thin film transistor layer disposed on the buffer layer;
    an OLED device layer disposed on the thin film transistor layer; and an encapsulation layer disposed on the organic light-emitting diode device layer.

\* \* \* \* \*

UNITED STATES PATENT AND TRADEMARK OFFICE
CERTIFICATE OF CORRECTION

PATENT NO. : 11,374,196 B2
APPLICATION NO. : 16/612381
DATED : June 28, 2022
INVENTOR(S) : Zhiwei Zhou It is certified that error appears in the above-identified patent and that said Letters Patent is hereby corrected as shown below:

On the Title Page

Item (73) Assignee:
"Wuhan China Star Optoelectronies Semiconductor Display Technology Co., Ltd."
Should be changed to:
-- Wuhan China Star Optoelectronics Semiconductor Display Technology Co., Ltd. --

Signed and Sealed this
Twentieth Day of December, 2022

Katherine Kelly Vidal
*Director of the United States Patent and Trademark Office*